(12) United States Patent
Devanney

(10) Patent No.: US 6,225,652 B1
(45) Date of Patent: May 1, 2001

(54) VERTICAL LASER FUSE STRUCTURE ALLOWING INCREASED PACKING DENSITY

(75) Inventor: William L. Devanney, Menlo Park, CA (US)

(73) Assignee: Clear Logic, Inc., San Jose, CA (US)

( * ) Notice: Subject to any disclaimer, the term of this patent is extended or adjusted under 35 U.S.C. 154(b) by 0 days.

(21) Appl. No.: 09/365,494

(22) Filed: Aug. 2, 1999

(51) Int. Cl.[7] .................................................. H01L 27/10
(52) U.S. Cl. ........................ 257/209; 257/529; 257/758
(58) Field of Search .................................. 257/529, 209, 257/758

(56) References Cited

U.S. PATENT DOCUMENTS

| | | | | |
|---|---|---|---|---|
| 4,592,802 | * | 6/1986 | Deleonibus et al. | 257/754 |
| 4,682,204 | * | 7/1987 | Shiozaki et al. | 257/529 |
| 4,751,197 | * | 6/1988 | Wills | 437/174 |
| 4,853,758 | * | 8/1989 | Fischer | 257/529 |
| 4,933,898 | * | 6/1990 | Gilberg et al. | 257/659 |
| 5,049,969 | * | 9/1991 | Orbach et al. | 257/211 |
| 5,321,300 | * | 6/1994 | Usuda et al. | 257/529 |
| 5,729,042 | * | 3/1998 | Lou et al. | 257/529 |
| 5,760,674 | * | 6/1998 | Gilmour et al. | 257/529 |
| 5,949,323 | * | 9/1999 | Huggins et al. | 257/529 |

* cited by examiner

*Primary Examiner*—Sara Crane
(74) *Attorney, Agent, or Firm*—Sjkerven, Morrill, MacPherson LLP; Tom Chen

(57) ABSTRACT

A laser fuse structure and array are provided which use vertical vias to connect the fuse body of the laser fuse to an interconnect layer. The vias extend downward from the fuse body and thus require less layout area. The thermal conductivity of the vias are minimized by restricting their cross-sectional area and by using tungsten as the via fill material. In some embodiments, an underlying conductive line is widened to minimize damage to the line during lasering. In another embodiment, the width of the fuse body is increased to reduce the energy required to blow the fuse. As a result, unrelated circuit elements and patterned lines can be placed closer together in a laser fuse array, thereby increasing the packing density of such arrays.

19 Claims, 6 Drawing Sheets

VERTICAL LASER FUSE STRUCTURE ALLOWING INCREASED PACKING DENSITY

BACKGROUND

1. Field of Invention

This invention relates to laser fuses for use in integrated circuits and more particularly to laser fuse structures which allow increased packing density in an integrated circuit.

2. Related Art

Laser fuses are in common use in the semiconductor industry as circuit elements for customizing alterations of individual integrated circuits (ICs) for the purpose of repair or reconfiguration. During laser configuration, specific fuses are blown open by a targeting laser beam resulting in a desired pattern of blown and not blown fuses as required by the repair or configuration scheme. Using laser fuse-based circuits, it is possible for defective memory bits to be swapped out of a memory array, for custom functions to turned on or off in an application-specific IC (ASIC), and for serial numbers to be written to individual ICs. Despite their usefulness, laser fuses are typically used sparingly in an IC due to the large layout area cost of each fuse, each fuse taking up the area of many transistors. This large area may be generally attributed to the long wavelength of light employed by lasers, the less controllable optical and positioning subsystems used in commercial lasering systems compared with wafer lithography systems, and the need to space off unrelated circuitry away from the laser fuse to avoid collateral damage during fuse blowing.

FIGS. 1, 2A, and 2B illustrate the large area requirements of conventional laser fuses. FIG. 1 shows the physical layout of an array 10 of conventional laser fuses 100, configured to connect perpendicular lines 110 and 120, as required to implement a laser configurable cross-point junction between orthogonal signal buses. Lines 110 are formed from an upper conductive layer, while lines 120 are formed from a lower conductive layer, these layers being separated by an intermediate insulating layer (not shown). A selection of interconnections between lines 110 and 120 is implemented by either blowing or retaining laser fuses 100.

FIG. 2A shows a detailed view of one portion of array 10 of FIG. 1 containing one fuse 100. Laser fuse 100 has a fuse body 210, which is typically the same width (FIG. 2A) or narrower (FIG. 2B) than connection terminals 220 of laser fuse 100. The term fuse body refers to that portion of the fuse structure which is irradiated by the laser beam and removed during lasering. If a disconnection is desired between line 110 and line 120, a laser is directed at an intended beam blast area 230 overlapping fuse body 210, blowing the fuse to effect the desired disconnection. A relatively high laser energy is required to blow fuse 100, and thus connection terminals 220 must be made long enough to protect connection nodes 240 from thermally conducted heat damage during lasering. This additional length adds to the Y-direction pitch as measured between lines 110. Additionally, since the laser beam typically has a radial Gaussian energy distribution, increasing the beam energy tends to laterally spread the beam blast area. Thus, adjacent lines 120 must be spaced off a greater distance in the X-direction to avoid collateral beam damage which might cut into these lines. As a consequence of the X-direction and Y-direction layout requirements, the packing density of conventional laser fuses 100 on an IC surface is relatively low, as is most evident when trying to lay out structures which use a large number of fuses such as a laser configurable cross-point junction between two wide signal buses. The result is an undesirable lower density and/or larger size IC.

Laser fuse designs must also take into account the heat transfer effects that occur during and immediately after fuse blowing. A principle design objective is that the greatest portion of the laser energy goes into heating the fuse body and the lowest portion go into heating surrounding or underlying structures. This minimizes damage to nearby structures, and also lowers the energy required to blow the fuse, thus allowing use of a less powerful and therefore smaller diameter laser beam. This design objective is ideally satisfied by having the fuse body be maximally thermally isolated from other structures. The glass insulator enclosing the fuse body approximates this requirement as it provides good thermal insulation as well as electrical insulation, but the electrical terminals of the fuse are problematic. The materials typically used to form the electrical terminals (either metals or polysilicon) have a high thermal conductivity when compared with the glass insulation, and thus form an undesirable thermal path for heat to escape the fuse body and cause damage to nearby structures, while making it harder to blow the fuse by sapping thermal energy out of the blast zone.

In conventional laser fuse designs, this heat conduction problem is minimized by implementing long fuse connection terminal nodes 220 between the laser blast area and the fuse connection nodes to reduce the heat transferred to the connection nodes. A number of inventions have further addressed the problem of thermal management. For example, in Lou et al., U.S. Pat. No. 5,729,042, entitled "Raised Fuse Structure For Laser Repair", a pedestal structure is disclosed to improve the thermal flow characteristics, and in Shiozaki et al., U.S. Pat. No. 4,682,204, entitled "Fuse Element For Integrated Circuit Memory Device", a corrugated surface is used under the fuse terminals to increase their effective thermal length, both of which are incorporated by reference in their entirety.

Any technique that can reduce the amount of energy required to blow a fuse is also found useful. A well-known technique is to cover the fuse body with a thin layer of glass so as to form a bomb-vessel enclosure of the fuse body. This results in a more uniform vaporization of the fuse and in lower energy requirements when compared with open-top fuses which may splatter and tend to form connective stringers unless shot with high energy or multiple pulses. For example, in Fischer, U.S. Pat. No. 4,853,758, entitled "Laser-Blown Fuses", a fabrication process is disclosed that reduces the energy required to blow a fuse by controlling the thickness of the overlying thin glass layer, and in Gilmour et al., U.S. Pat. No. 5,760,674, entitled "Fusible Links With Improved Interconnect Structure", a distinct intermediate interconnect level is used to space off the fuse body from the electrical terminals of the fuse, both of which are incorporated by reference in their entirety. Note that the lateral interconnections used by Gilmour et al. provide thermal isolation, but still require significant layout space.

Accordingly, it is desirable to have a laser fuse structure which allows increased packing density of laser fuse elements on a IC surface both through minimized layout dimensions and through improved thermal management techniques.

SUMMARY

The present invention provides a laser fuse structure and array using a vertical via to connect the laser fuse body with an underlying conductive line, wherein the fuse body is on one conductive layer and is directly above one or more connection vias to a lower conductive layer. Because the via connection terminals are located directly below the fuse body instead of off to one side, the lateral dimensions of the fuse are reduced, which allows more laser fuse structures to be placed in an array. As a result, less chip surface area is required for the placement of such fuses, thereby increasing the packing density of ICs using such fuses.

A further advantage of the present invention is that the via may be optimized to control the amount of thermal conduction away from the fuse body, thus reducing the amount of laser blast heat transferred out of the fuse body into the surrounding circuitry. In one embodiment of this invention, the horizontal cross-section of the via should be made small so as to minimize the unwanted thermal conduction away from the along this terminal connection. Also, forming the via from a material with a lower thermal conductivity than the fuse body, such as tungsten for an aluminum fuse body, serves to further limit the unwanted conduction of heat away from the fuse body along the conduction terminals.

In one embodiment of the present invention, the via is placed in the approximate center of the fuse body, which provides two advantages. If the via is placed in the approximate center of the beam target area, then the undesirable energy loss along the via terminal path will pull energy out of the hottest area of the fuse body at the center of the beam target area instead of pulling it out of the cooler portions of the fuse body near the perimeter. This results in a more even distribution of heat across the fuse body during lasering, which incrementally improves the fuse blowing dynamics. Furthermore, since the via connection is made near the center of the beam target area, it is less likely that residual conductive stringers will form a leakage shorting path across the fuse terminals, since the central area of a blown fuse cavity is generally found to have less residual debris than is found along the edges of the cavity after laser blasting. In conventional laser fuses, fuse blast debris which is caught along the sidewalls of the blast cavity may reconnect the fuse terminals and cause a leakage path. However, if the via is placed in the center of the fuse body, blast debris caught along the sidewall will not have the effect of shorting across the fuse terminals because the via terminal is in the bottom center of the fuse cavity, not along the sidewalls.

In some embodiments of the present invention, the fuse body is also increased beyond the minimum allowed line width for a given process technology. While widening the fuse body would appear to detract from fuse packing density, experimental data has shown that by widening the fuse body it may be possible to improve the laser blowing dynamics such that significantly less laser energy is required to blow the fuse. Since less laser energy is used, the potential collateral heat damage effect of the laser beam is also reduced, such that unrelated circuit elements may typically be placed closer to the fuse body without risk of damage. As a result, packing density is increased despite increasing the size of the fuse body structures. Fuse bodies with shapes which are approximately circular are found to require less energy to blow, and thus may require the least space-off of unrelated circuitry from the fuse body.

In other embodiments, the portion of the underlying conducting line directly below the fuse body can be widened to provide increased protection to the line. In a cross-point junction application, it is undesirable to sever the conduction lines which pass through the junction. By widening the lines passing under the vertical fuses in the cross-point junction, the risk of severing an underlying line during laser programming is reduced. Furthermore, a widened line can serve as a partial mirror, reflecting infrared (IR) energy back onto the exploding fuse body during lasering, thus reducing the laser energy required to blow the fuse.

The present invention will be better understood in light of the following detailed description taken together with the accompanying drawings.

BRIEF DESCRIPTION OF THE DRAWINGS

FIG. 2B is a top view of a portion of the array of

FIG. 1 with another type of conventional laser fuse;

DETAILED DESCRIPTION OF THE INVENTION

The present invention provides a laser fuse structure having vertical vias to connect the fuse body with underlying conductive lines. The use of vertical vias allows both increased packing density of the laser fuses and reduced laser energy requirements to blow the fuses.

Figure 2A:
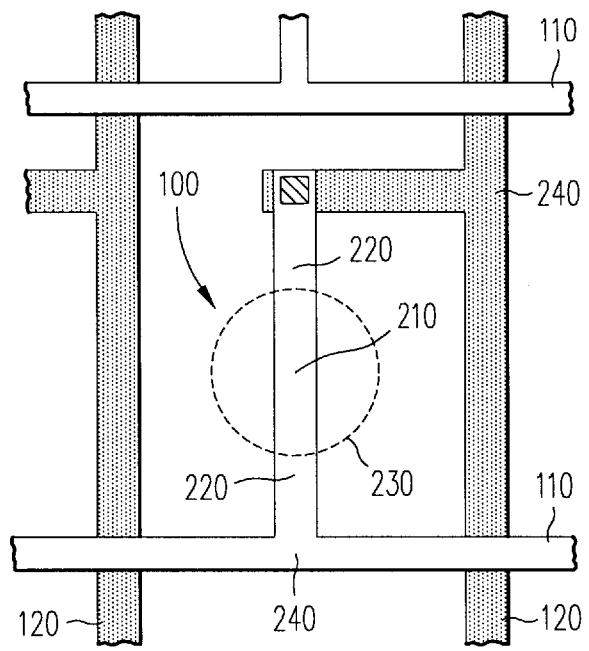
FIG. 2A is a top view of a portion of the array of FIG. 1 with single conventional laser fuse.
Figure 2B:
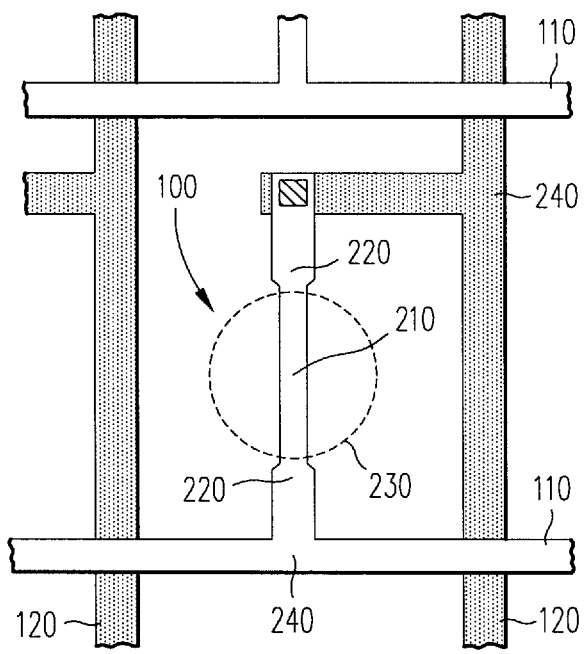
Figure 3:
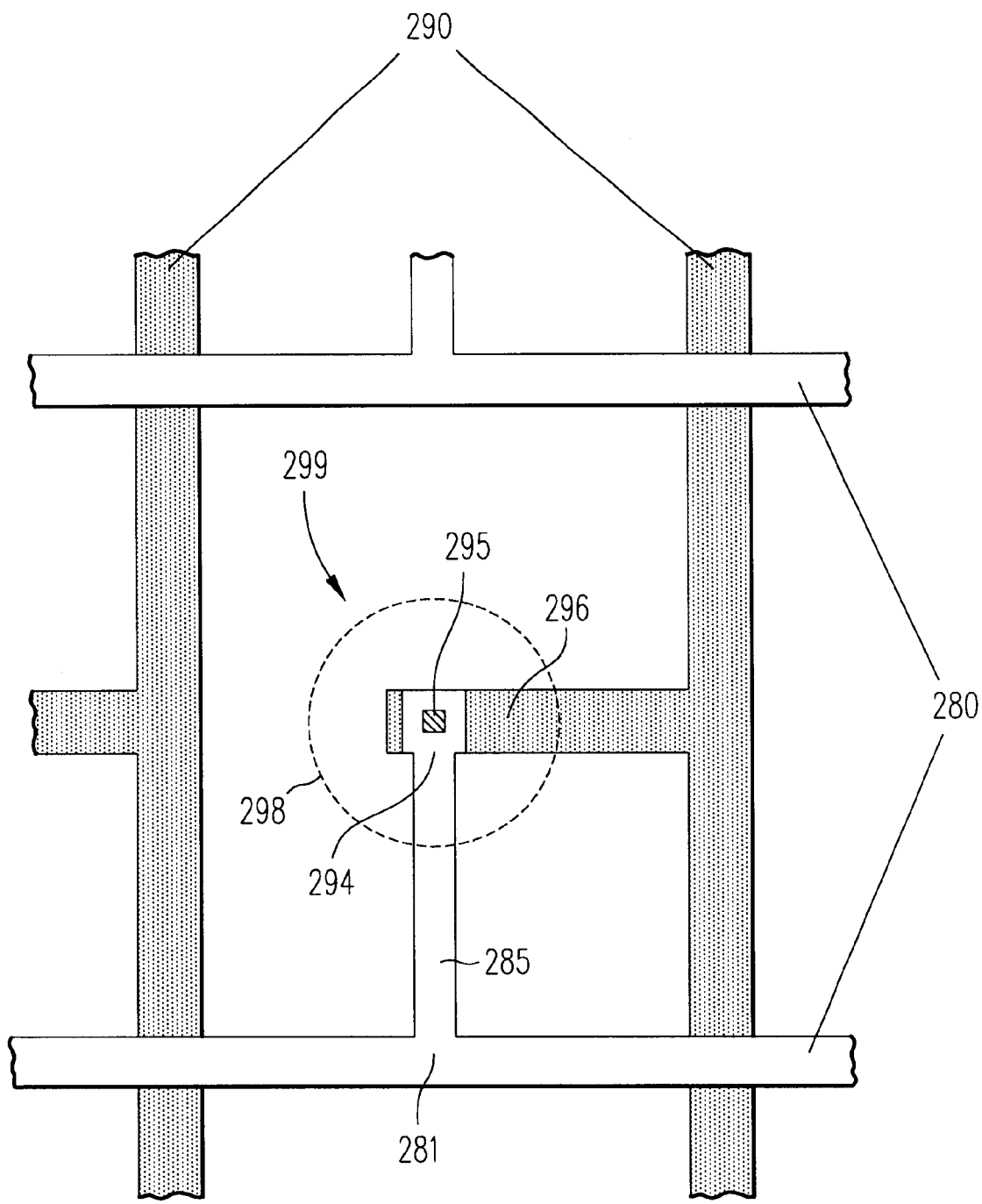
FIG. 3 is a top view of a laser fuse according to one embodiment of the present invention.

FIG. 3 is the top view of a laser fuse 299 of the present invention. Laser fuse 299 connects conductive lines 280 and 290 (drawn orthogonally as is common in cross-point junction applications). Similar to laser fuse 100 of FIGS. 1, 2A, and 2B, laser fuse 299 has a fuse body 294 approximately co-planar with one layer of conductive lines 280 and connected to conductive lines 280 by a connection terminal 285 and connection node 281. However, contrary to laser fuse 100, which relies on the length of fuse connection terminal 220 to thermally isolate connection node 240 from fuse body 210, the fuse body 294 of laser fuse 299 lies directly above portions of connection node 296 and utilizes the thermal resistance of via 295 to provide isolation from damage to lines 290. The result is that one connection terminal 285 is implemented in accordance with conventional laser fuses, while the other connection terminal is implemented with a via 295 directly connecting fuse body 294 to underlying connection node 296. The integrated circuit can then be customized by selectively directing a laser beam at a selective laser blast area 298 to either sever a connection or leave a connection intact. Note that via 295 is shown located at the approximate center of blast area 298. However, via 295, as well as the vias used in fuse structures discussed below, can be located in other positions. For example, the via can be located under any portion of the fuse body that receives a radiation intensity equal to 50% or greater of the peak laser radiation intensity used to program the fuse body.

Figure 4A:
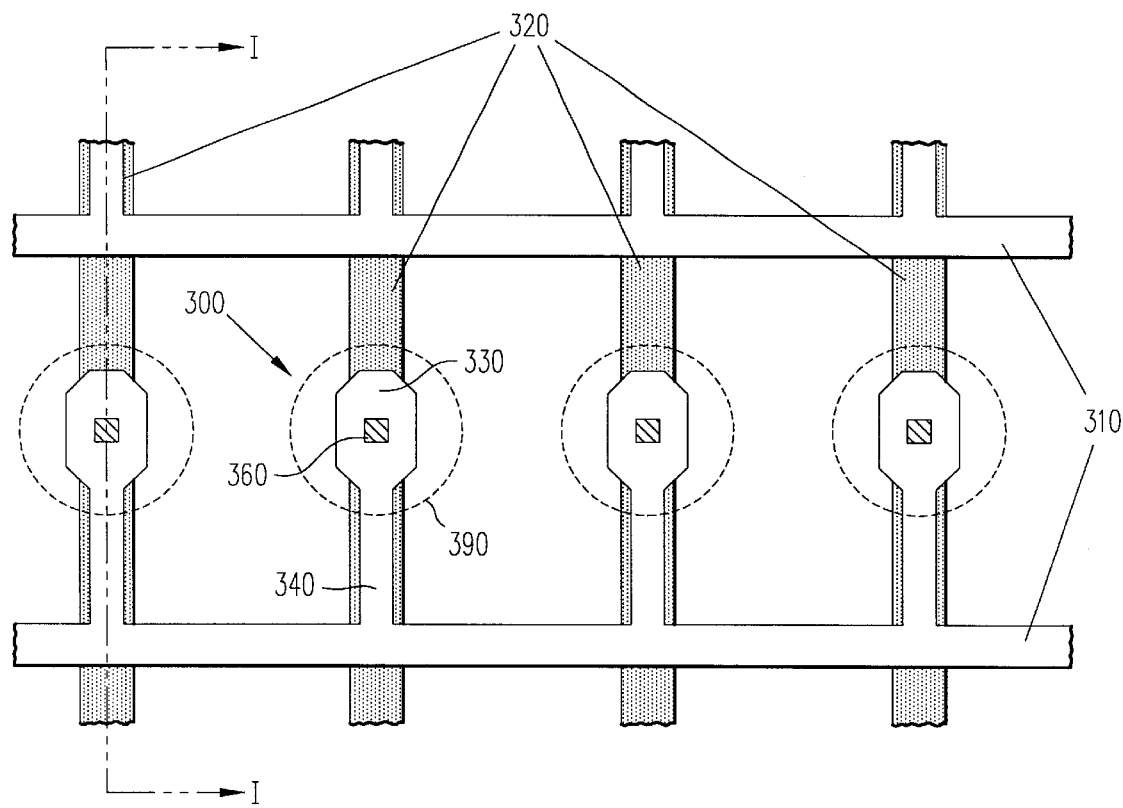
FIG. 4A is a top view of a laser fuse according to another embodiment of the present invention.
Figure 4B:
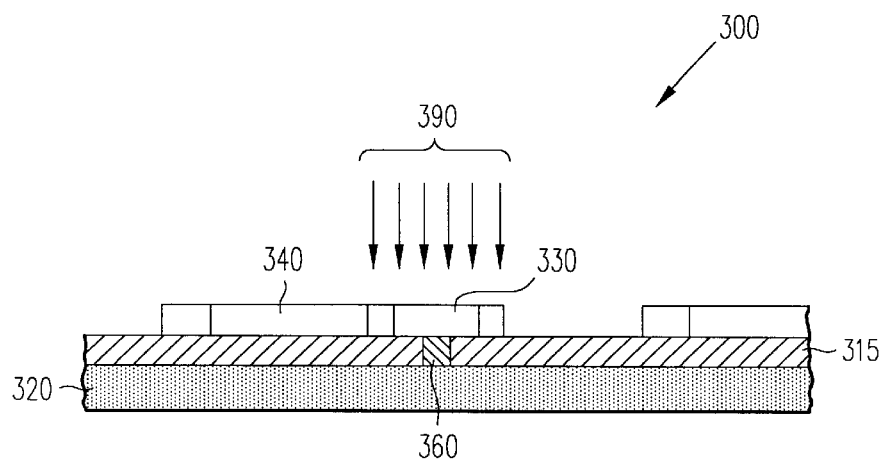
FIG. 4B is a side view of the laser fuse of FIG. 4A along sectional line I–I'.

FIGS. 4A and 4B are top and side views, respectively, of a laser fuse 300 according to another embodiment of the present invention. FIG. 4B is a side view along sectional line I–I' of FIG. 4A. Laser fuse 300 connects conductive lines 310 and 320. As with laser fuse 299 of FIG. 3, laser fuse 300 has a fuse body 330 approximately co-planar with one layer of conductive lines 310 and connected to conductive lines 310 by connection terminals 340. However, contrary to laser fuse 299, which is positioned away from and parallel to lines (i.e., lines 290) on the other conductive layer, laser fuse 300 lies directly above conductive lines 320 on the other layer. Thus, laser fuse 300 is connects lines 310 to lines 320 without the need for connection nodes 296. A via 360, extending downward from a fuse body 330 of laser fuse 300, connects fuse body 330 with conductive lines 320. In FIG.

4B, via 360 is shown extending through an insulating layer 315 between fuse body 330 and conductive lines 320. The result is that one connection terminal 340 is implemented in accordance with conventional laser fuses, while the other connection terminal is implemented as via 360 directly connecting fuse body 330 to underlying conductive line 320. The integrated circuit can then be customized by selectively directing a laser beam at a selective laser blast area 390 to either sever a connection or leave a connection intact.

Figure 1:
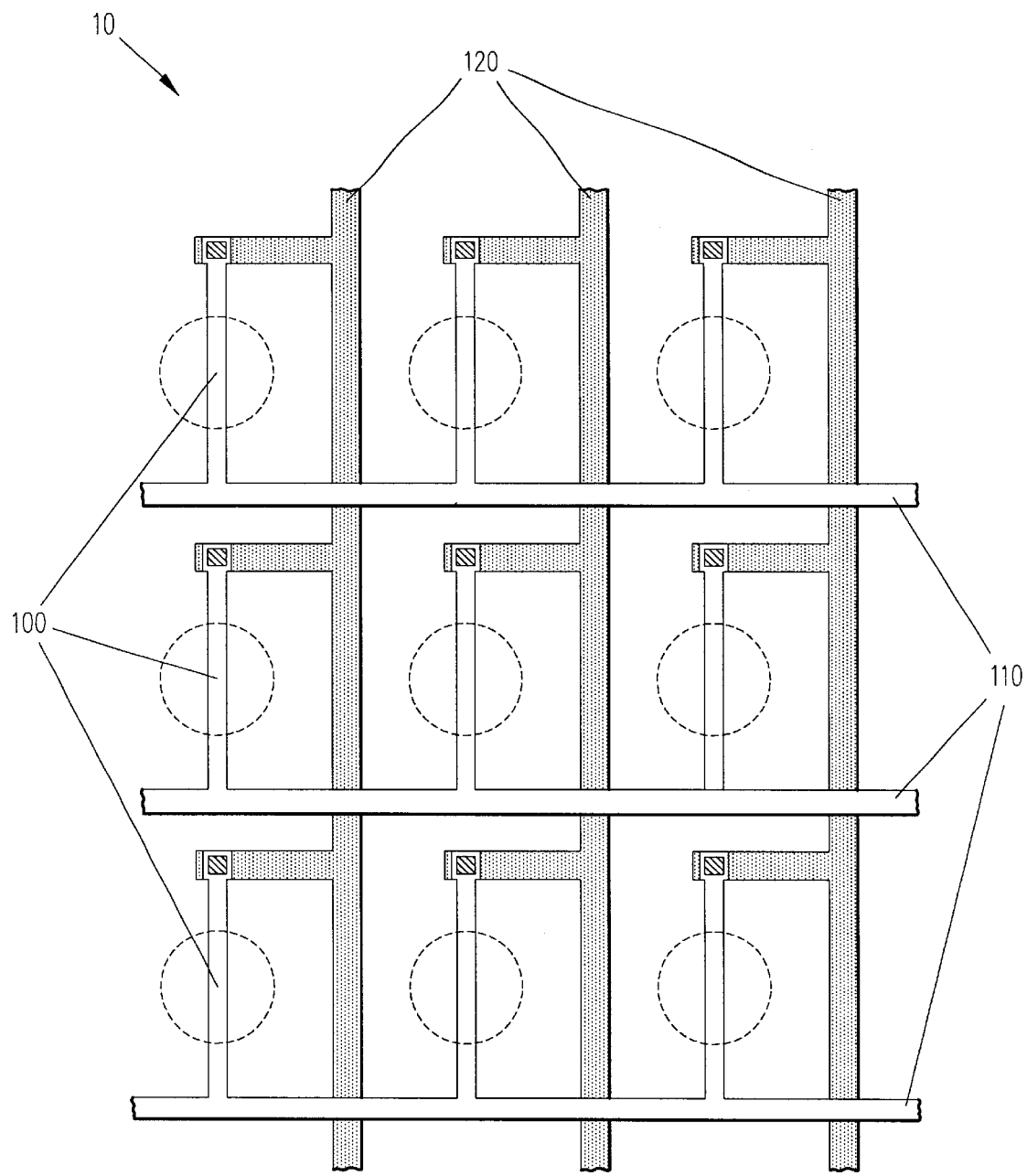
FIG. 1 is top view of an array of conventional laser fuses connecting lines on two conductive layers.

Since via 360 extends vertically, instead of laterally, from the surface of the fuse, the line-to-line pitch of fuse arrays employing the present invention is improved when compared with conventional laser fuse arrays of FIG. 1. In addition, underlying conductive lines 320 can be formed directly beneath the fuse instead of off to one side, further improving packing density. As a result, the packing density of laser fuses 300 is greatly increased over conventional laser fuse structures of FIG. 1, which translates directly into reduced manufacturing costs.

In another embodiment, the vertical fuse structure utilizes vias with small lateral dimensions to reduce thermal conduction from the blast area. By decreasing the lateral or horizontal dimensions of via 360, more thermal energy is retained in fuse body 330, thereby reducing the amount of energy needed to blow laser fuse 300. Furthermore, less heat is transferred downward through via 360, resulting in a lower probability of heat damage to lines 320. For example, the horizontal cross-sectional area of the via used to connect the fuse body with an underlying conductive line can be limited to less than twice the horizontal cross-sectional area of the smallest non-fuse vias used elsewhere on the integrated circuit to transit the same insulating layer. In practical applications, the cross-sectional area of the vias can be 1 square micron or less.

In addition to decreasing the lateral size of the vias, thermal conductivity and energy requirements can be further improved by filling the via with a material having a lower thermal conductivity than the fuse body. For example, if aluminum or copper is used as the main component of the fuse body, tungsten (with a lower thermal conductivity of 114 W/m°K), may be used instead of copper or aluminum (with respective conductivities of 407 W/m°K and 237 W/m°K), to form the via and thus improve the laser blowing mechanics by restricting heat flow out of the laser blast area. Tungsten is commonly used in various planarization and step coverage schemes and thus is typically available as a processing material in current wafer manufacturing flows. If a given wafer manufacturing process uses tungsten filled plugs to improve the step coverage of non-fuse vias, then this same fill step operation can be used to form the laser fuse vias 360, and thus no additional steps need be added to the baseline process to accommodate this embodiment. Additionally, because tungsten is more resistant to vaporization than aluminum (with boiling points of 5500° C. and 2441° C. respectively), the use of tungsten vias makes it easier to vaporize the aluminum fuse body while still retaining the fuse via, thus minimizing damage to the fuse via and the circuitry connected to the terminal. In applications where tungsten is not, for some reason, found desirable, polysilicon may also serve as a useful via fill material, as its thermal conductivity is typically less than 130 W/m°K (the exact number depending on grain size and doping).

Figure 5:
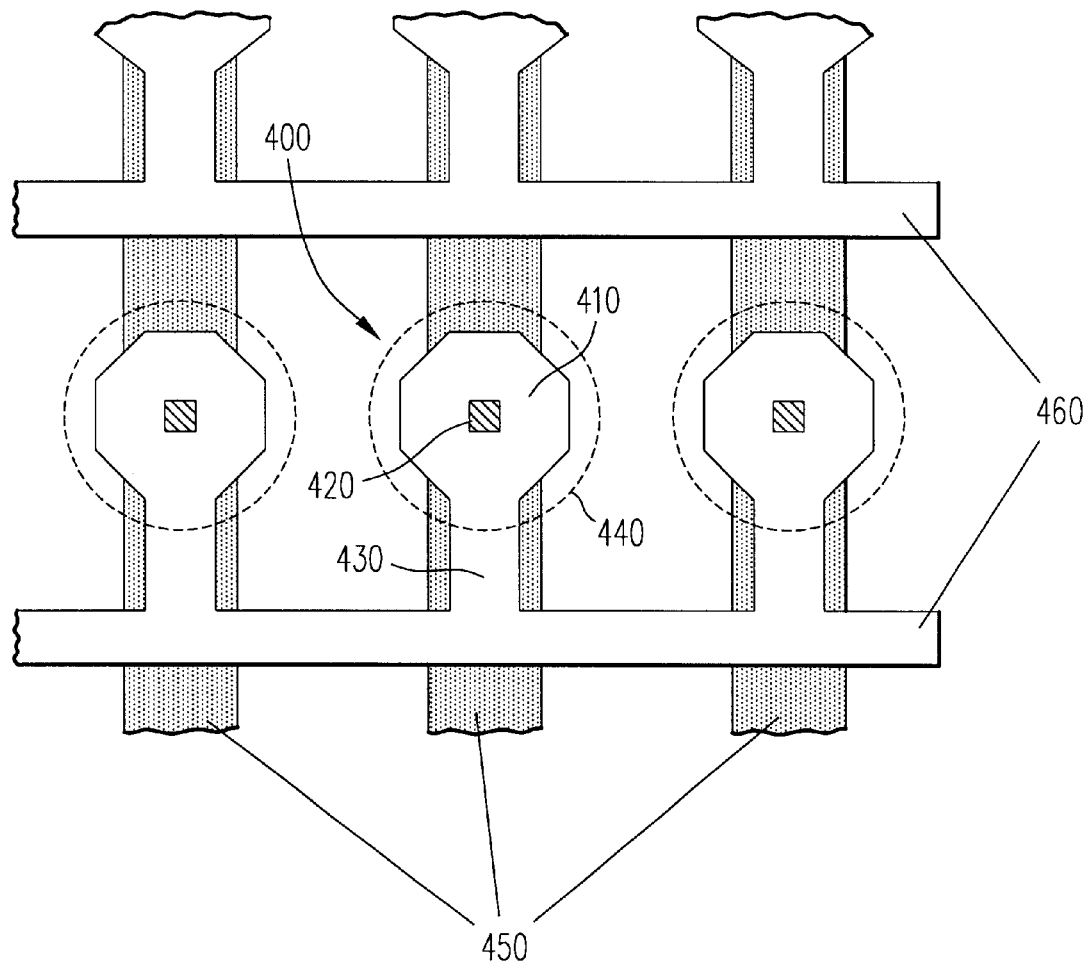
FIG. 5 is a top view of a laser fuse array according to another embodiment of the present invention.

A further embodiment of the present invention is shown in FIG. 5, in which laser fuse 400 differs from laser fuse 300 of FIG. 4A only in the shape of the fuse body. A laser fuse structure having a similarly improved fuse body is disclosed in commonly-owned U.S. Pat. App. Ser. No. 09/107,841, entitled "Non-Uniform Width Configurable Fuse Structure", filed Jun. 30, 1998, which is incorporated herein by reference in its entirety. Laser fuse 400 is composed of three sections, a fuse body 410, a connection terminal 430, and a fuse via 420. Fuse body 410 receives the principal portion of the laser energy delivered to laser blast area 440. In this embodiment, fuse body 410 is wider than the previously illustrated fuse body 330 in FIG. 4A, which reduces the amount of energy required to blow the fuse as it is found experimentally that by maximizing the ratio of the surface area to the perimeter of fuse body 410, the energy and vapor pressure required to blow a fuse are minimized, as explained in U.S. Pat. App. Ser. No. 09/107,841, referenced above. Accordingly, the shape of fuse body 410 is made to approximate a circle because this shape maximizes the surface area-to-perimeter ratio. However, in typical IC applications where curved lines are disallowed in layout, such a fuse may be implemented with a polygonal-shaped fuse body, as shown in FIG. 5, which generally reduces the required laser energy, thus reducing the risk of heat damage to adjacent structures.

As a result, conductive lines 450 can be spaced closer together in the x-direction, and conductive lines 460 can be spaced closer together in the y-direction. Note that the width of fuse body 410 is typically 125% to 200% the width of minimum width lines implemented in the same layer as fuse body 410, and that connection terminal 430 is typically minimum width. However, as will be appreciated by those skilled in the art, any shape and width of fuse body 410 which is wider than connection terminal 430 will provide advantages over the structure of fuse 100 of FIG. 1. Other type shapes of fuse bodies also suitable for use with the invention include a convex polygonal shape, a circular shape, or an oblong shape.

Via 420 is given a small cross-sectional area to restrict the undesired heat conduction out of fuse body 410 and thus minimizing the energy needed to blow the fuse. This lower energy correspondingly reduces the need to have long connection terminals when compared with laser fuse 100 of FIG. 1. Thus fuse connection nodes can be brought closer to the fuse body center, thereby further increasing the packing density of fuses. As a result, the area occupied by an array using laser fuses 400 of FIG. 5 can be decreased to only approximately ⅓ the area of an array using conventional fuses laid out using similar design rules.

Figure 6:
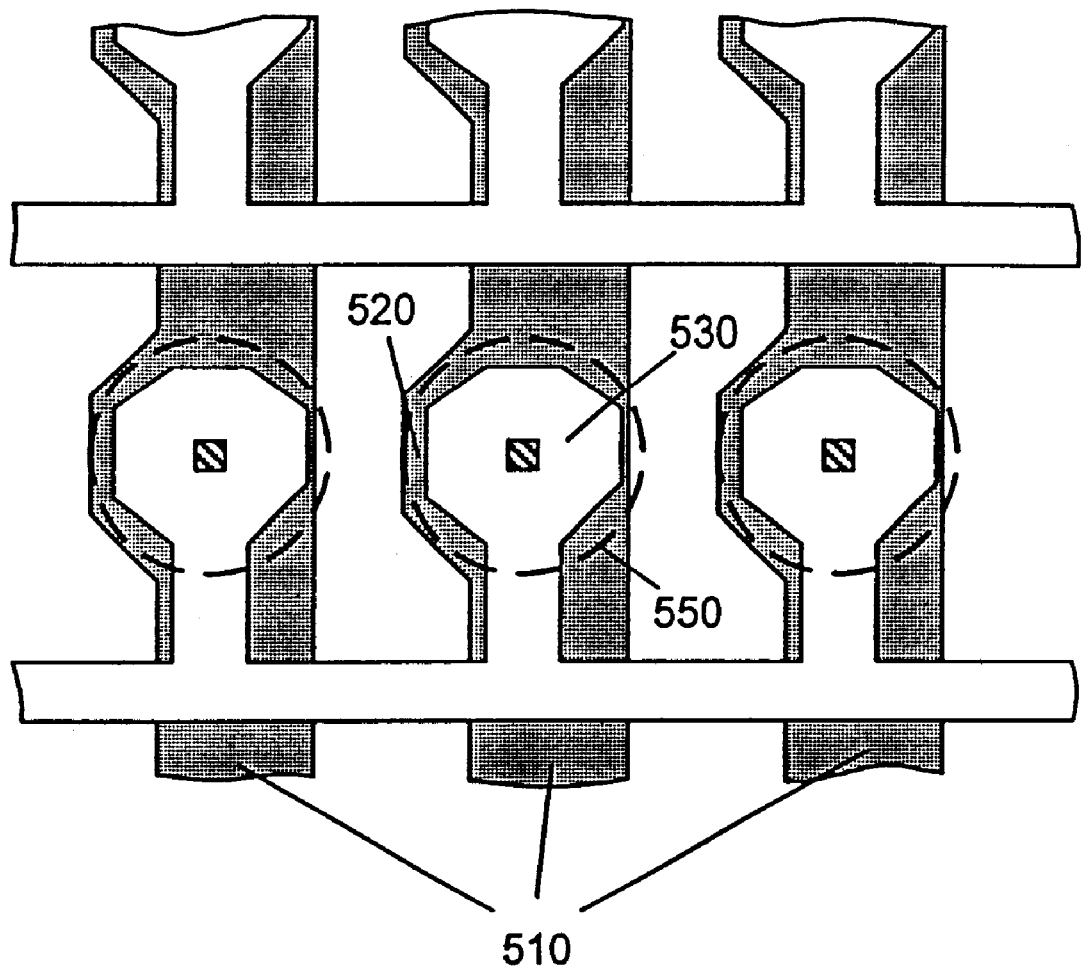
FIG. 6 is a top view of a laser fuse array according to a further embodiment of the present invention.

FIG. 6 shows yet another embodiment of the present invention, in which an underlying conductive line 510 is widened to form a localized widened connection area 520 under a fuse body 530. For example, widened connection area 520 can be made at least twice as wide as the minimum width of connection lines on the same layer as conductive line 510, with a typical width of 2.0 microns or more. A widened connection area provides several advantages: a conductive line 510 is more resistant to being inadvertently cut because a wider area must be damaged across its entire width for the line to stop functioning; a widened connection area 520 also acts as a protective heat sink to retain portions of the excess energy from fuse blowing and thus minimize damage to structures adjacent or below. Note that substantially all of fuse body 530 should be located directly above widened connection area 520.

Furthermore, if conductive line 510 is made of aluminum or other similar material, widened connection area 520 also acts as an effective infrared (IR) mirror which bounces IR energy back up into the fuse as the fuse vaporizes and emits radiation. Experimental data has shown that use of a such a mirror surface under the fuse improves the fuse blowing process by further reducing the beam energy required to blow the fuse.

In some embodiments, the width of the widened connection area 520 is made, at its widest point, at least 125% the minimum width of normal interconnect lines implemented in the same layer as the widened connection area 520.

The size of widened connection area 520 in FIG. 6 is shown at least as large as fuse body 530 and an intended beam blast area 550. However, any widening of area 520 under fuse body 530 will provide the advantages associated with this embodiment.

It should be noted that increasing the width of underlying conductive line 510 is not imperative to protecting those interconnect lines. Because the laser pulse has a typical duration on the order of nanoseconds, while the thermodynamic effects of the heat conduction and the explosion of the fuse take much longer, little or no laser light penetrates the fuse itself. Thus, the fuse material does not have sufficient time to vaporize and expose the underlying conductive lines to direct laser light. Accordingly, if thermal conduction is well managed, lines of any dimension can run safely below the shadow of the fuse, particularly for the fuse discussed in conjunction with FIG. 5, which requires reduced laser energies for the fuse blowing process.

The above-described embodiments of the present invention are merely meant to be illustrative and not limiting. It will thus be obvious to those skilled in the art that various changes and modifications may be made without departing from this invention in its broader aspects. For example, the above description refers to the use of a single via and a conventional connection terminal as the two connection mechanisms, but schemes which use multiple vias are also possible, such as a two terminal fuse in which both terminals are implemented as vias. If the fuse body of a given process were on a third layer above the interconnect lines and not on one of the two layers used for the interconnect lines, it would be appropriate to use two via connections to implement the fuse structure, rather than a via and a terminal, to increase the advantages associated with this invention. Therefore, the appended claims encompass all such changes and modifications as fall within the true spirit and scope of this invention.

What is claimed is:

1. A fuse structure for connecting patterned electrically conductive layers of an integrated circuit, comprising:
   a fuse body having only two electrical terminals, the fuse body formed in a first patterned electrically conductive layer, said fuse body being irradiated by a targetable energy beam to effect a disconnect;
   a first electrical terminal connecting said fuse body to a second patterned electrically conductive layer; and
   a second electrical terminal connecting said fuse body to a third patterned electrically conductive layer, wherein said second electrical terminal extends downward from the fuse body in the form of an electrically conductive via.

2. The fuse structure of claim 1, wherein said electrically conductive via has cross-sectional area less than twice the cross-sectional area of the smallest non-fuse via used in said integrated circuit between said first patterned electrically conductive layer and said third patterned electrically conductive layer.

3. The fuse structure of claim 1, wherein said electrically conductive via has horizontal cross-sectional area less than 1 square micron.

4. The fuse structure of claim 1, wherein said electrically conductive via is comprised of a first material and said fuse body is comprised of a second material, wherein said first material has a lower thermal conductivity than said second material.

5. The fuse structure of claim 4, wherein said first material is substantially comprised of tungsten and said second material is substantially comprised of aluminum or copper.

6. The fuse structure of claim 4, wherein said first material is substantially comprised of polysilicon and said second material is substantially comprised of aluminum or copper.

7. The fuse structure of claim 1, wherein said first patterned electrically conductive layer and said second patterned electrically conductive layer are the same layer.

8. The fuse structure of claim 1, wherein said first and second patterned electrically conductive layers are approximately co-planar.

9. The fuse structure of claim 1, wherein all portions of said electrically conductive via are located directly below said fuse body.

10. The fuse structure of claim 1, wherein all portions of said electrically conductive via are under the highly exposed region of said fuse body, defined as the region of the fuse body receiving a radiation intensity equal to 50% or greater of the peak laser radiation intensity used to program said fuse body.

11. The fuse structure of claim 10, wherein said electrically conductive via is placed substantially in the center of said highly exposed region.

12. The fuse structure of claim 1, wherein said via is connected to a widened connection area in said third patterned electrically conductive layer, said widened connection area having a local width greater than twice the minimum line width for connection lines made elsewhere in said third patterned electrically conductive layer on said integrated circuit.

13. The fuse structure of claim 12, wherein said widened connection area comprises a connection line with said local width greater than 2.0 microns.

14. The fuse structure of claim 1, wherein said via is connected to a widened connection area formed in said third patterned electrically conductive layer, said widened connection area being wide enough that substantially all of said fuse body lies directly above a portion of said widened connection area.

15. The fuse structure of claim 1, wherein the width of said fuse body is at some point greater than 125% the minimum width of said first terminal.

16. The fuse structure of claim 1, wherein the width of said fuse body is at some point greater than 125% the width of the narrowest conductive lines implemented in said first patterned conductive layer.

17. The fuse structure of claim 16, wherein said fuse body has a convex polygonal shape.

18. The fuse structure of claim 16, wherein said fuse body has a circular or oblong shape.

19. The fuse structure of claim 1, wherein said targetable energy beam is a laser beam.

* * * * *